(12) United States Patent
Vollrath

(10) Patent No.: US 7,372,095 B2
(45) Date of Patent: May 13, 2008

(54) INTEGRATED SEMICONDUCTOR CIRCUIT COMPRISING A TRANSISTOR AND A STRIP CONDUCTOR

(75) Inventor: Joerg Vollrath, Olching (DE)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 11/213,342

(22) Filed: Aug. 26, 2005

(65) Prior Publication Data

US 2006/0049469 A1    Mar. 9, 2006

Related U.S. Application Data

(63) Continuation of application No. PCT/DE2004/000383, filed on Mar. 1, 2004.

(30) Foreign Application Priority Data

Feb. 28, 2003   (DE)   ................. 103 08 927

(51) Int. Cl.
*H01L 29/76*   (2006.01)
*H01L 29/788*   (2006.01)
(52) U.S. Cl. ................ 257/314; 257/321; 257/324; 257/E29.268; 257/E29.279
(58) Field of Classification Search ................ 257/314, 257/321, 324, E29.268, E29.279
See application file for complete search history.

(56) References Cited

U.S. PATENT DOCUMENTS

| 4,087,795 A * | 5/1978 | Rossler .................. 365/185.29 |
| 5,414,290 A * | 5/1995 | Bauer .......................... 257/341 |
| 5,557,569 A | 9/1996 | Smayling et al. |
| 6,008,516 A | 12/1999 | Mehrad et al. |
| 6,072,720 A | 6/2000 | Peng et al. |
| 6,163,043 A | 12/2000 | Hirano et al. |
| 6,211,544 B1 | 4/2001 | Park et al. |
| 6,249,028 B1 | 6/2001 | Bryant et al. |
| 6,420,743 B1 | 7/2002 | Hirano et al. |
| 6,649,972 B2 * | 11/2003 | Eitan .......................... 257/324 |
| 2002/0060927 A1 | 5/2002 | Egawa et al. |

(Continued)

FOREIGN PATENT DOCUMENTS

DE    43 15 178 A1    11/1994

(Continued)

OTHER PUBLICATIONS

English Translation of Office Action for related Chinese Patent Application No. 200480005541.8, 6 pages.

*Primary Examiner*—Matthew E. Warren
(74) *Attorney, Agent, or Firm*—Slater & Matsil, L.L.P.

(57) ABSTRACT

An integrated semiconductor circuit includes a transistor and a strip conductor (11). The transistor includes a first (1) and a second source/drain region (2) and a gate electrode. The strip conductor (11) is electrically insulated from a semiconductor body at least by a gate dielectric and forms the gate electrode in the area of the transistor. The strip conductor (11) extends along a first direction (x) in the area of the transistor. The second source/drain region (2) is arranged offset with respect to the first source/drain region (1) in the first direction (x). The transistor thus formed has an inversion channel (K1) that only extends between two corner areas (1a, 2a) facing one another of the first and of the second source/drain region, i.e. is much narrower than in the case of a conventional transistor.

17 Claims, 6 Drawing Sheets

| | U.S. PATENT DOCUMENTS | | | JP | 59-224168 | 12/1984 |
|---|---|---|---|---|---|---|
| | | | | KR | 200154509 Y | 8/1999 |
| 2003/0011202 A1 | 1/2003 | Kwak | | KR | 2000-0028643 | 5/2000 |
| | | | | KR | 20010007124 | 1/2001 |
| | FOREIGN PATENT DOCUMENTS | | | KR | 2001-0054509 | 7/2001 |
| EP | 0 836 226 A1 | 4/1998 | | | | |
| EP | 1037280 A2 | 2/2000 | | * cited by examiner | | |

INTEGRATED SEMICONDUCTOR CIRCUIT COMPRISING A TRANSISTOR AND A STRIP CONDUCTOR

This application is a continuation of co-pending International Application No. PCT/DE2004/000383, filed Mar. 1, 2004, which designated the United States and was not published in English, and which is based on German Application No. 103 08 927.6 filed Feb. 28, 2003, both of which applications are incorporated herein by reference.

TECHNICAL FIELD

The invention relates to an integrated semiconductor circuit comprising a transistor and a strip conductor.

BACKGROUND

Semiconductor circuits are implemented, for example, as CMOS (complementary metal oxide semiconductor) circuits and have transistors produced in MOS technology that form inversion channels of electrons or holes underneath a strip conductor. In this arrangement, two source/drain regions are formed opposite one another on both sides of a strip conductor as implantation areas in a semiconductor substrate. The strip conductor is used as gate electrode in the area of the transistor and controls the formation or prevention of an inversion channel by means of its electrical potential. The inversion channel extends closely underneath the semiconductor surface in the semiconductor substrate, to be precise underneath a gate oxide layer between the facing sides of the two source/drain regions of the transistor. The width of the channel in this case extends over the width of both source/drain areas along the direction of the extent of the strip conductor. Usually, both the length of the channel and the width of the channel in each case correspond to the optical limit of resolution F which can be achieved with the lithographic exposure device used in each case.

The transistor described above can be used, in particular, as storage transistor in nonvolatile semiconductor memories. In this case, it has between the strip conductor and the semiconductor substrate a charge-storing layer which spatially binds electrical charges that are scattered into this layer during the formation of an inversion channel and, as a result, can store digital information. In such storage circuits, there is a requirement for techniques that reduce the storage density, i.e. the number of storable information items per unit of substrate area. The object of miniaturizing electrical circuits also presents itself in the case of logic circuits.

SUMMARY OF THE INVENTION

In one aspect, the present invention provides a semiconductor circuit that exhibits a larger number of electrical components per substrate base area without reducing the optical limit of resolution. In particular, the number of inversion channels that can be formed in a semiconductor substrate is to be increased by a factor of up to two, the substrate base area remaining the same.

According to preferred embodiments of the invention, a semiconductor integrated circuit includes a transistor and a strip conductor. The transistor includes first and second source/drain regions that are arranged in a semiconductor body, e.g., a substrate. The transistor further includes a gate electrode. The strip conductor is electrically insulated from the semiconductor substrate at least by a gate dielectric and forms the gate electrode in the area of the transistor. The strip conductor extends along a first direction in the area of the transistor. The second source/drain region is arranged offset with respect to the first source/drain region in the first direction. The transistor also includes a charge-storing layer between the gate electrode and the semiconductor substrate.

According to embodiments of the invention, a semiconductor circuit includes a transistor, preferably in MOS construction, with two source/drain regions mutually offset in the direction of the extent of the strip conductor. The strip conductor, in the area of the transistor, forms its gate electrode. Conventional semiconductor transistors have two source/drain regions, both of which adjoin the same or largely identical strip conductor sections so that the inversion channel essentially extends over the entire width of the two source/drain regions between them. The inversion channel thus has a width which corresponds to the optical limit of resolution.

In contrast, according to embodiments of the invention, the first and the second source/drain region are mutually offset in the direction of the extent of the strip conductor so that the inversion channel no longer takes up the entire width of both source/drain regions measured in the direction of the extent of the strip conductor but only extends between mutually nearest adjacent corner areas of the first and the second source/drain region. Due to the lateral offset of the second source/drain region with respect to the first one, the shortest possible connection between the two regions is, for example, the line joining a right-hand corner area of the first region facing the second region and a left-hand corner area of the second region facing the first region. An inversion channel will no longer reach the edge areas of the source/drain regions adjoining these corner areas over the entire length of these edge areas but will essentially only short circuit the corner areas facing one another. Since such an inversion channel between the regions offset with respect to one another takes up a much smaller substrate base area, the potential for saving area on the semiconductor substrate is increased.

The inversion channel is essentially formed along the line joining the two mutually nearest adjacent corner areas of the source/drain regions. The other two corner areas adjoining the strip conductor base area can be used for forming further inversion channels to other regions. Since the rectangular or square base area of a source/drain region has four corners, the density of transistors can be increased by a factor of up to two.

According to embodiments of the invention, the transistor exhibits between the gate electrode and the semiconductor substrate a charge-storing layer in which electrical charges are locally bonded. Such a transistor is suitable as storage transistor for non-volatile semiconductor memories. By scattering in highly energetic charge carriers from an inversion channel, locally bonded charge states are created in the charge-storing layer above the first and/or to the second source/drain region. This storage mechanism is utilized with mirror bit technology. The storage density that can be created by this means can be doubled with the aid of the present invention since charges are now only stored at corner areas instead of edge areas of the source/drain regions in the charge-storing layer.

It is preferably provided that the second source/drain region is arranged offset with respect to the first source/drain region by a distance corresponding to the width of the first source/drain region along the first direction. The first and the second source/drain region thus adjoin two different successive sections of the strip conductor. The second source/drain region begins on the first side of the strip conductor where the first source/drain region ends on the second side of the strip conductor. Due to this offset, a number of source/drain regions can be alternately lined up on both sides of the strip conductor. Between different inversion channels underneath the strip conductor, a distance corresponding approximately to the optical limit of resolution exists in the direction of the extent of the strip conductor.

It is preferably provided that the first and the second source/drain region have a rectangular base area in the semiconductor substrate and that, in the switched-on state, the transistor forms an inversion channel that extends only between a single corner area of the first source/drain region facing the second source/drain region and a single corner area of the second source/drain region facing the first source/drain region. Thus, two corner areas of the second source/drain region adjoining the strip conductor in the direction and in the opposite direction of the extent of the strip conductor can be used for forming one inversion channel each. In particular, the transistor forms an inversion channel which is narrower than half of the width of the first or of the second source/drain region measured in the direction of the extent of the strip conductor.

Accordingly, it is provided that the transistor stores electrical charges in the charge-storing layer exclusively at the corner area of the first source/drain region facing the second source/drain region and/or at the corner area of the second source/drain region facing the first source/drain region. The storage of electrical charges exclusively at corner areas of source/drain regions is achieved by the fact that an electrical insulation layer between the semiconductor substrate and the charge-storing layer has a layer thickness which is of such a magnitude that the electrical insulation layer can be tunneled through by electrical charges of an inversion channel only at corner areas of the source/drain regions.

A further development provides that the first and the second source/drain region can be optionally electrically biased positively or negatively with respect to one another. Between the regions, an inversion channel can then flow in both directions and, with a sufficiently high source-drain voltage, store in each case a digital information item at the corner area of the first or second region.

It is preferably provided that a third source/drain region is provided which is arranged on the same side of the strip conductor as the first source/drain region and which is arranged offset with respect to the second source/drain region in the first direction. As a result, an inversion channel can be formed between a corner area of the second source/drain region facing the third source/drain region and a corner area of the third source/drain region facing the second source/drain region. The first and the third source/drain region are arranged on the side of the strip conductor opposite to the second source/drain region and are arranged offset in mutually opposite directions relative to the second source/drain region, i.e. in the direction and in the opposite direction of the extent of the strip conductor in the area of the second source/drain region. Thus, an inversion channel extending to the second source/drain region, and thus a separate transistor, can be formed between in each case one of the first and third source/drain regions. The inversion channels of both transistors in each case extend to different corner areas, adjacent to the strip conductor, of the second source/drain region. The first and the third source/drain region are preferably at a distance from one another which corresponds to the width of the second source/drain region in the direction of the extent of the strip conductor, i.e. along the first direction.

Preferably, a fourth source/drain region is provided and is arranged on the same side of the strip conductor as the second source/drain region and is arranged offset with respect to the third source/drain region in the first direction. Thus, a further inversion channel can be formed between a corner area of the third source/drain region facing the fourth source/drain region and a corner area of the fourth source/drain region facing the third source/drain region. In this manner, both corner areas, adjacent to the strip conductor, of the third source/drain region can be utilized for forming one transistor each analogously to the aforementioned embodiment. Analogously, further source/drain regions can be alternately lined up along the strip conductor on both sides of it, as a result of which a particularly dense arrangement of transistors, particularly storage transistors, is produced.

It is preferably provided that the charge-storing layer is a nitride layer which is surrounded by electrical insulation layers on both sides. In particular, one oxide layer each can be provided on and underneath the nitride layer, the lower oxide layer simultaneously being used as gate dielectric.

A further development of the invention provides that the semiconductor circuit exhibits adjacently to the second source/drain region a further strip conductor extending in parallel with the strip conductor and a fifth source/drain region, the fifth source/drain region being arranged on the side of the further strip conductor opposite to the second source/drain region and being arranged offset with respect to the second source/drain region in the first direction. As a result, a further inversion channel can be formed between a corner area of the second source/drain region facing the fifth source/drain region and a corner area of the fifth source/drain region facing the second source/drain region. Thus, those corner areas of the second source/drain region facing away from the first strip conductor and being adjacent to a further second strip conductor are also used for forming transistors. With the aid of additional strip conductors and transistors formed on them, dense two-dimensional logic or storage circuits can be implemented.

It is preferably provided that a sixth source/drain region is provided which is faced by a corner area of the second source/drain region. With the aid of the first, the third, the fifth and the sixth source/drain region, up to four inversion channels can be formed which extend to in each case different corner areas of the second source/drain region. Whereas a maximum of two inversion channels can extend to one and the same source/drain region in conventional semiconductor circuits, up to 50% of the previously needed substrate surface is saved in accordance with the invention.

The semiconductor circuit is preferably a non-volatile memory circuit in which one digital information item each can be stored at each corner area of the second source/drain region. When mirror bit technology is used, one further digital information item each can be additionally stored at a corner area of a source/drain region adjacent to the second source/drain region by each of the inversion channels extending to the second source/drain region.

As an alternative, the semiconductor circuit can be a logical part-circuit in which the first, the second and the fifth source/drain region and the two strip conductors form two series-connected logic transistors.

More complicated logic circuits can also be implemented with the aid of a two-dimensional network from transistors formed on strip conductors.

BRIEF DESCRIPTION OF THE DRAWINGS

In the text which follows, the invention will be described with reference to FIGS. 1 to 10, in which.

DETAILED DESCRIPTION OF ILLUSTRATIVE EMBODIMENTS

Figure 1:
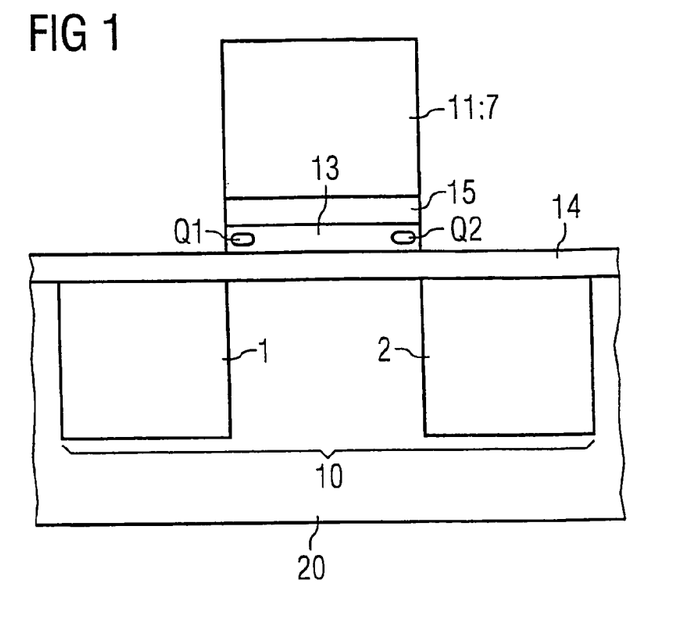
FIG. 1 shows a cross-sectional view of a semiconductor circuit according to the invention comprising one transistor.

FIG. 1 shows a transistor 10 comprising a first 1 and a second source/drain region 2 which are formed in a semiconductor body 20. The body 20 can be a bulk substrate or other semiconductor layer or region. Between the two regions 1, 2 and above the semiconductor body 20, a strip conductor 11 that forms the gate electrode 7 in the area of the transistor 10. Between the strip conductor 11 and the semiconductor substrate 20, a lower oxide layer 14 which, at the same time, forms the gate dielectric of the transistor, a charge-storing layer 13 and an upper oxide layer 15 are arranged. The charge-storing layer 13 spatially bonds charges Q1, Q2 which are scattered into the charge-storing layer through the gate oxide layer 14, as a result of which digital information items can be stored as locally bonded charge quantities Q1, Q2.

Figure 2:
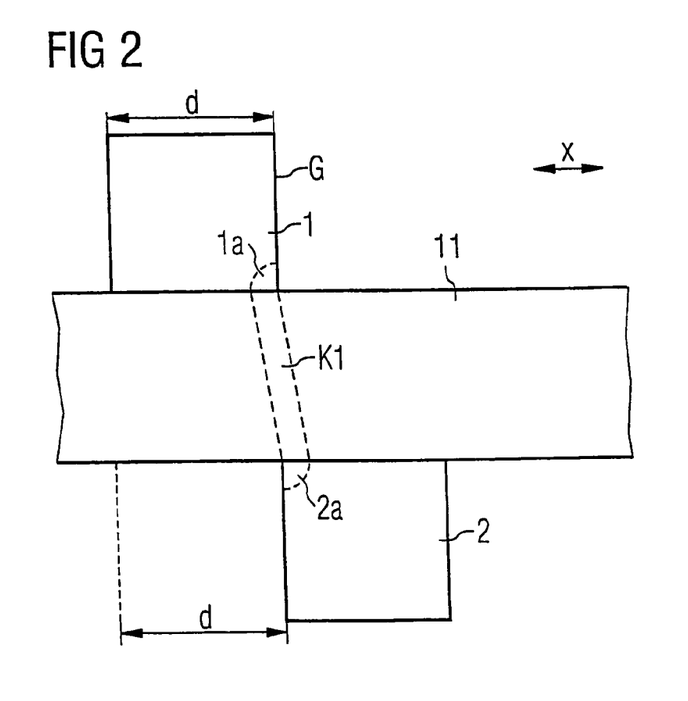
FIG. 2 shows a top view of the semiconductor circuit from FIG. 1.

As shown in a top view in FIG. 2, the first and the second source/drain region 1, 2 are mutually offset in the direction of the extent of the strip conductor 11, i.e. the first direction x. In the direction x, the base area G of the first region 1 has a width d. In a conventional transistor, the second region 2 would also be arranged along the strip conductor section d of the strip conductor 11. According to the invention, in contrast, the second region 2 is offset with respect to the first one in the direction x, preferably precisely by the distance d. As a result, the transistor channel K1 is not completely formed between the facing edge areas of the regions 1, 2 but only between a corner area 1a of the first region and a corner area 2a of the second region 2. The channel K1 formed between these mutually facing corner areas 1a, 2a is thus narrower than a conventional transistor channel and requires less substrate base area.

Figure 3:
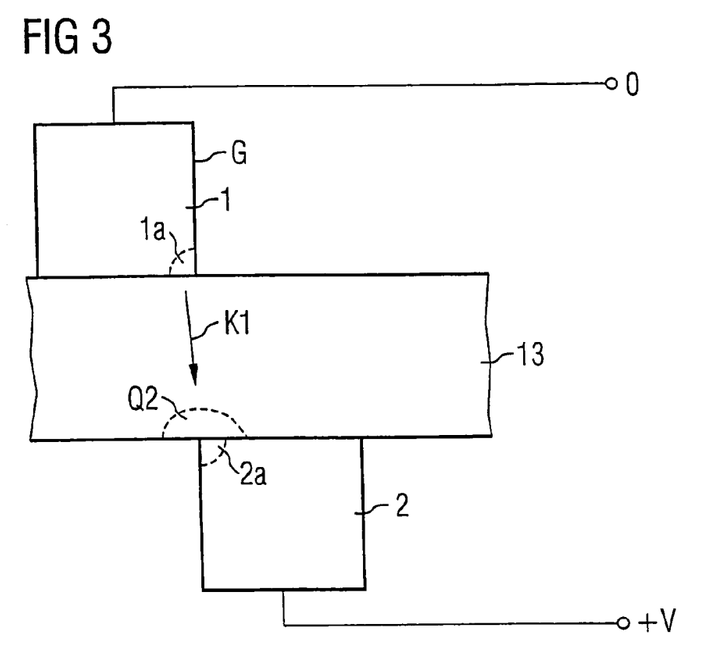
FIGS. 3 and 4 show various alternatives of an electrical contact arrangement of the semiconductor circuit from FIG. 1.

FIG. 3 shows a possible circuit for a transistor according to the invention in nMOS construction (metal oxide semiconductor) in which the inversion channel K1 consisting of electrons flows from the first source/drain region 1 to the second source/drain region 2 which is biased with a positive electrical potential +V with respect to the first region 1 which, for example, is connected to ground 0. As a result, the electrons of the inversion channel K1 are accelerated in the direction of the arrow shown and due to scattering, pass through the gate oxide layer into the charge-storing layer where they are spatially bonded and form the charge quantity Q2. As shown in FIG. 3, the charge quantity Q2 is located in the charge-storing layer adjacently to the corner area 2a of the second source/drain region 2.

Figure 4:
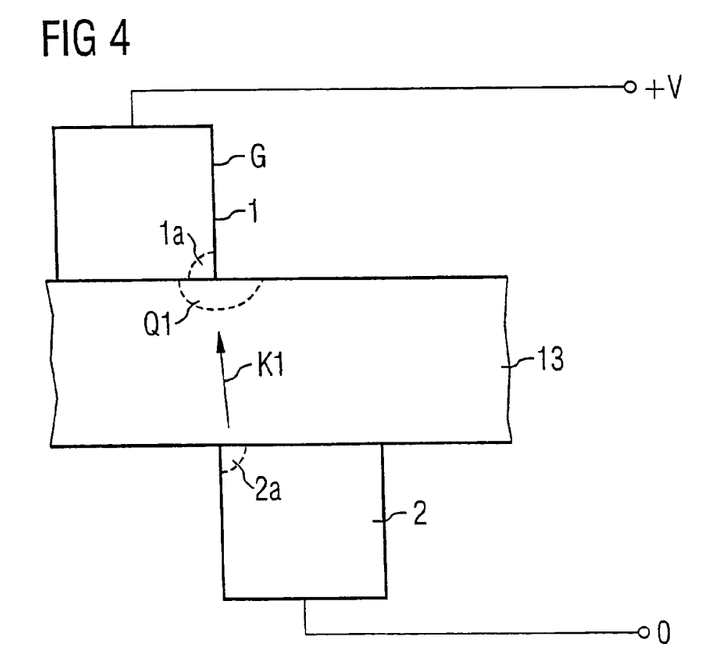

In the circuit, shown in FIG. 4, of the nMOS transistor from FIG. 3, the first source/drain region 1 is biased with a positive potential +V with respect to the second 2, so that the electrons are accelerated in the direction of the first region 1 and are stored as charge quantity Q1 in the area of the corner area 1a of the first region 1 due to scattering into the charge-storing layer. Depending on the direction of the current of the transistor channel, one charge each can thus be stored at a corner area 1a, 2a of the first or second source/drain region 1, 2. Only two corner areas 1a, 2a are involved in the inversion channel.

Figure 5:
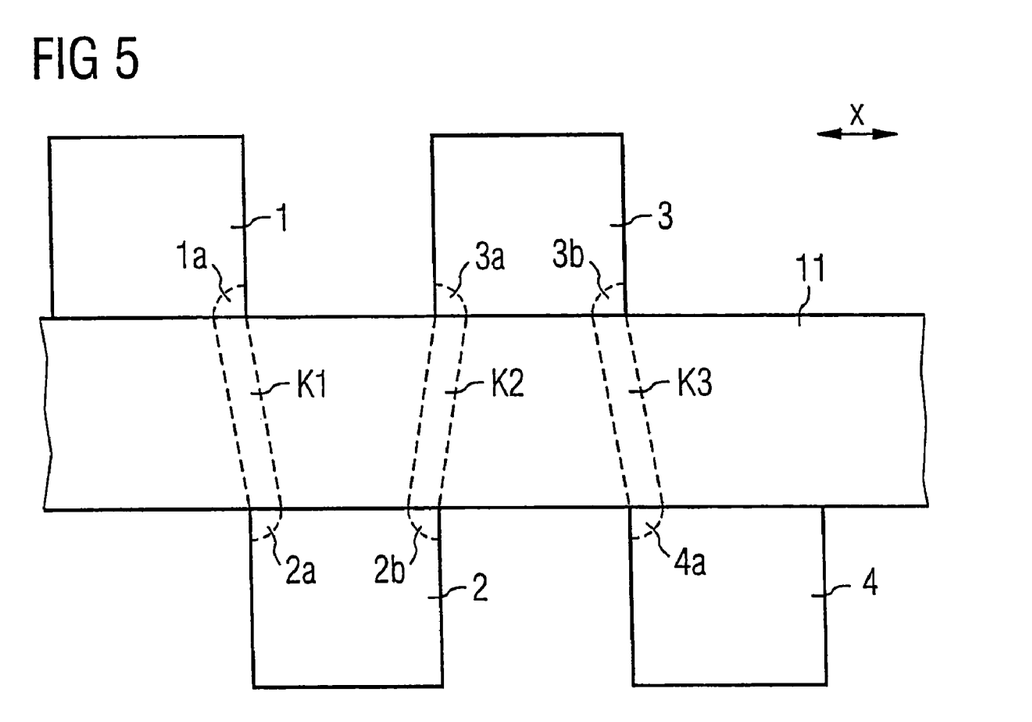
FIGS. 5 and 6 show further embodiments of the present invention comprising a number of source/drain regions.

As shown in FIG. 5, further inversion channels K2, K3 can be formed on the strip conductor 11 with a third 3 and a fourth source/drain region 4. The regions are alternately arranged offset with respect to one another on both sides of the strip conductor 11. According to FIG. 5, an inversion channel K2 is formed between a corner area 2b of the second region which faces the third source/drain region 3, and its corner area 3a. Analogously, a further inversion channel K3 extends between corner areas 3b, 4a of the third and of the fourth source/drain regions 3, 4. Further source/drain regions can be arranged on the strip conductor 11 and a further transistor channel can be formed per source/drain region.

Figure 6:
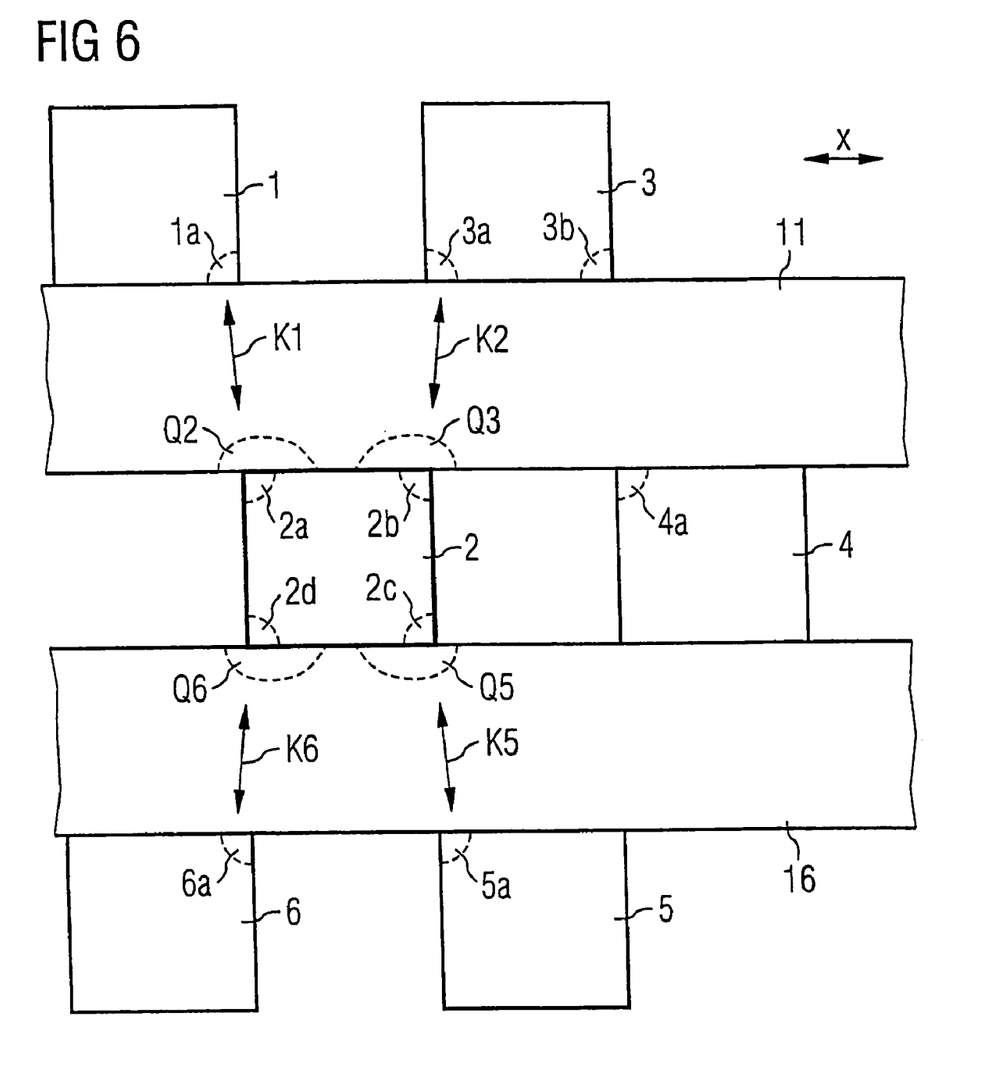

Further corner areas of this source/drain region which face away from the strip conductor 11 can also be used for forming further transistors. Thus, FIG. 6 shows, apart from the strip conductor 11, a further strip conductor 16 between which the second source/drain region 2 is located. The further strip conductor 16 is formed in the same manner as the strip conductor 11 and adjoins the second 2, the fourth 4 and a fifth 5 and a sixth source/drain region 6, these four source/drain regions also being arranged offset with respect to one another and in alternate sequence to the left and to the right of the further strip conductor 16. As a result, two further inversion channels K5, K6 coming from the second source/drain region can be formed which extend between a corner area 2c of the second region 2 and a corner area 5a of the fifth source/drain region 5 and between a corner area 2d of the second region and a corner area 6a of the sixth source/drain region. With these, two further digital information items can be stored by charge quantities Q5, Q6 scattered into a corresponding charge-storing layer under the further strip 16 at the corner areas 2c, 2d. All transistors of the semiconductor circuit according to the invention, shown or indicated in the figures, can also be formed without a charge-storing layer, for example only with a gate dielectric 14 between the gate electrode 7 and the semiconductor substrate 20, in which case they can be used as logic transistors or as transistors for any other circuits. In this case, the indicated charge quantities Q1 to Q6 are omitted.

Figure 7:
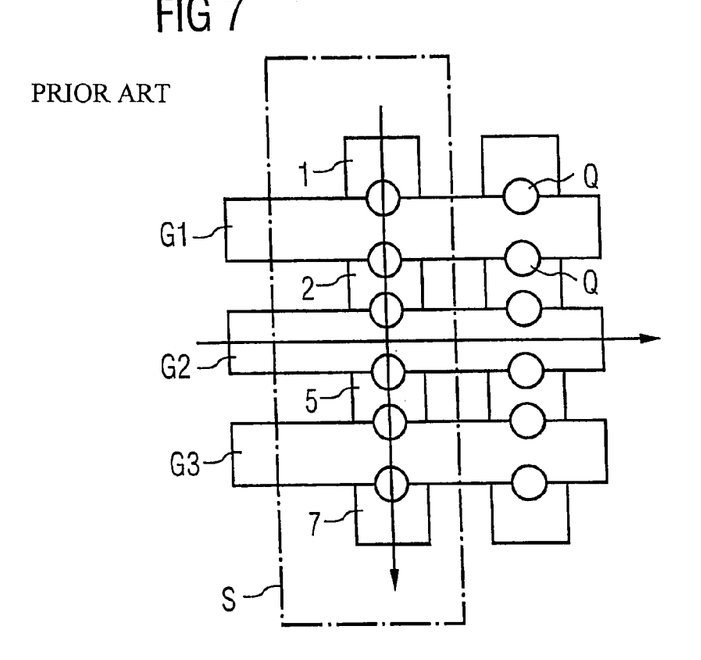
FIGS. 7 and 8 show schematic views of a conventional semiconductor circuit and a semiconductor circuit according to the invention.

FIG. 7 shows a schematic top view of a conventional semiconductor circuit which can be, for example, a logic part-circuit. Three strip conductors G1, G2, G3 are shown which are used as gate electrodes. Between the strip conductors, source/drain areas 1, 2, 5, 7 are shown that are arranged in two rows between the strip conductors G1, G2, G3. In the conventional semiconductor circuit of FIG. 7, these source/drain regions are not offset with respect to one another. Q denotes charge quantities indicated in circles which are arranged in the charge-storing layer along the entire edges of the source/drain areas. Accordingly, an inversion channel takes up the entire width of a source/drain area along the extent of, for example, the strip conductor G2. The semiconductor circuit illustrated in FIG. 7 represents a part-circuit of an NAND gate in which three transistors are connected in series in the direction of the arrow extending vertically. A current can only flow through this series circuit of three transistors if a gate voltage is applied in each of the transistors such as shown, for example, for the center transistor with the gate electrode G2 by means of the horizontal arrow.

Figure 8:
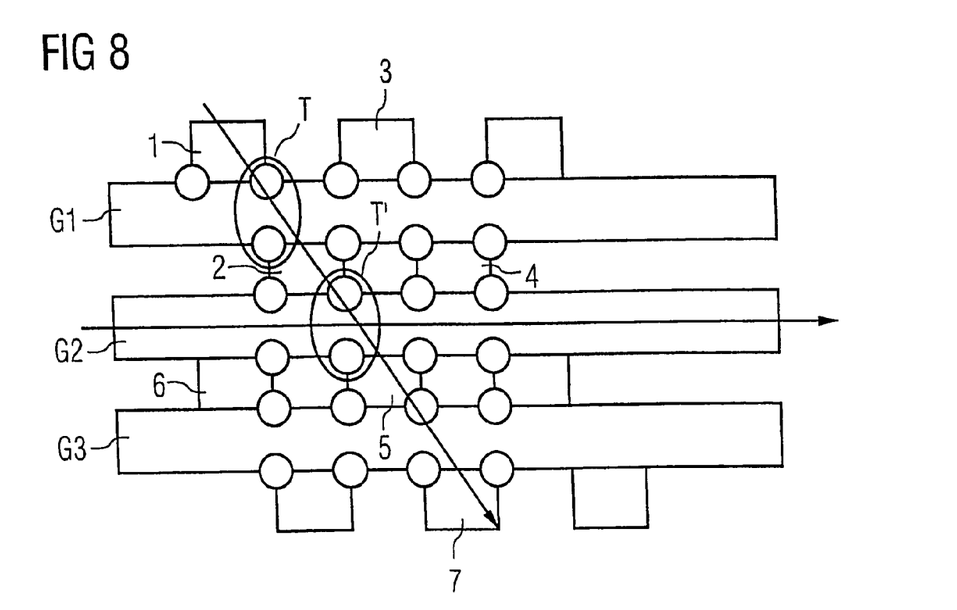

FIG. 8 shows a semiconductor circuit according to the invention by means of which the part-circuit of FIG. 7 can be realized with source/drain regions mutually offset in the direction of strip conductors. Also shown are three strip conductors G1, G2, G3 and a number of source/drain regions 1, 2, 3, 4, 5, 6, 7 of which, for example, the first, second, fifth and seventh source/drain region can be connected to form three series-connected transistors as indicated by the diagonal arrow. In particular, the first and the second source/drain region 1, 2, together with the strip conductor G1, form a first transistor T, and the second and the fifth source/drain region 2, 5, together with the second strip conductor G2, form a second transistor T'. The circuit operates in the same manner as in FIG. 7 but can be arranged much more densely together with other circuit elements. In particular, FIG. 8 shows possible starting and end points of further inversion channels which are indicated by circles at the corner areas of the source/drain regions. As indicated by comparison with FIG. 7, these starting and end areas of the inversion channels are packed much more densely.

Figure 9:
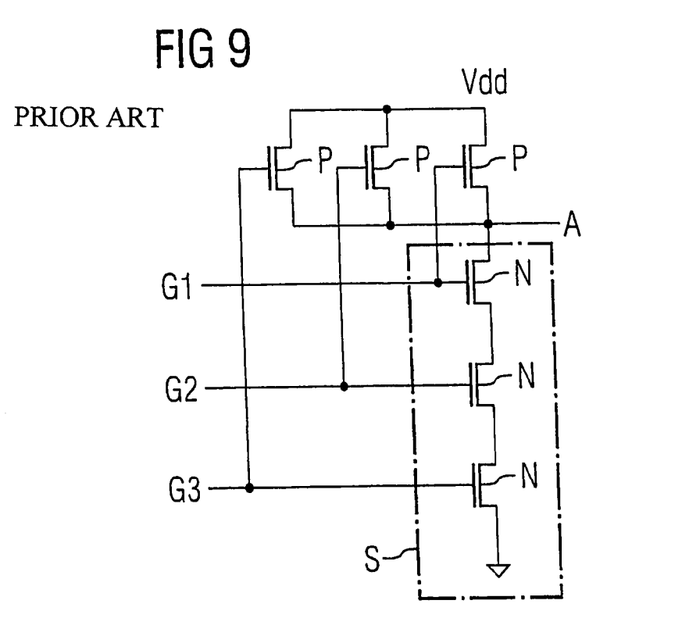
FIGS. 9 and 10 show circuit diagrams of special logic circuits which in each case can be implemented by a conventional semiconductor circuit or a semiconductor circuit according to the invention.
Figure 10:
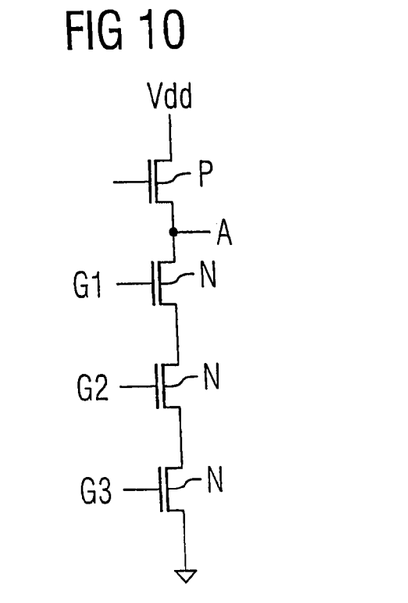

The circuits shown in FIGS. 7 and 8 represent part-circuits of a NAND gate. FIGS. 9 and 10 show the complete circuit diagram of such a circuit. In each case, three n-channel transistors N connected to common gate electrodes G1, G2 and G3 and further p-channel transistors P are shown, the part-circuit S corresponding to that of the in each case three transistors in FIGS. 7, 8. The three n-channel transistors N are connected in series and are connected to a signal output A. If only one of these three transistors does not conduct, the corresponding p-channel transistor connected to the same gate line is conducting and connects the potential of the signal output A to the operating voltage Vdd. If all three n-channel transistors are conducting, the signal output A is grounded. The circuit shown in FIG. 10, in which the signal output A is first connected to the operating voltage via a p-channel transistor P and only then, with the transistor P switched off, are possible gate voltages applied to the gate lines G1, G2 and G3 in order to subsequently ground the signal output A if required, has the same switching character.

Using the present invention, any other logical part-circuit can be produced. The advantage of densely packed inversion channels can be utilized, in particular, in storage circuits in which information items are stored in a charge-storing layer of the transistor or in another structure.

What is claimed is:

1. A semiconductor integrated circuit comprising:
    a strip conductor extending over a semiconductor body along a first direction;
    a charge storing layer between the strip conductor and the semiconductor body;
    a first source/drain region disposed in the semiconductor body adjacent a first edge of the strip conductor; and
    a second source/drain region disposed in the semiconductor body adjacent a second edge of the strip conductor, the second edge being opposite the first edge in a second direction that is perpendicular to the first direction;
    wherein, when viewed from above, the first source/drain region has a first side that is adjacent to the first edge of the strip conductor and the second source/drain region has a second side that is adjacent to the second edge of the strip conductor, and wherein the second source/drain region is arranged offset with respect to the first source/drain region along the first direction so that the second side is not positioned across from the first side, along the second direction; and
    wherein the first and the second source/drain regions each have a rectangular base area in the semiconductor body and wherein an inversion channel extends between a corner area of the first source/drain region facing the second source/drain region and a corner area of the second source/drain region facing the first source/drain region.

2. The integrated circuit as claimed in claim 1, further comprising a gate dielectric between the strip conductor and the semiconductor body.

3. The integrated circuit as claimed in claim 1, wherein the charge-storing layer comprises a charge-storing layer in which electrical charges are locally bound.

4. A semiconductor integrated circuit comprising: a strip conductor extending over a semiconductor body along a first direction;
    a charge storing layer between the strip conductor and the semiconductor body;
    a first source/drain region disposed in the semiconductor body adjacent a first edge of the strip conductor; and
    a second source/drain region disposed in the semiconductor body adjacent a second edge of the strip conductor, the second edge being opposite the first edge in a second direction that is perpendicular to the first direction;
    wherein, when viewed from above, the first source/drain region has a first side that is adjacent to the first edge of the strip conductor and the second source/drain region has a second side that is adjacent to the second edge of the strip conductor, and wherein the second source/drain region is arranged offset with respect to the first source/drain region along the first direction so that the second side is not positioned across from the first side, along the second direction; and
    wherein the second source/drain region is arranged offset with respect to the first source/drain region by a distance corresponding to the width of the first source/drain region along the first direction.

5. The integrated circuit as claimed in claim 4, wherein the first and the second source/drain regions each have a rectangular base area in the semiconductor body and wherein an inversion channel extends between a corner area of the first source/drain region facing the second source/drain region and a corner area of the second source/drain region facing the first source/drain region.

6. A semiconductor integrated circuit comprising:
    a transistor including a first source/drain region and a second source/drain region arranged in a semiconductor body, the transistor further including a gate electrode overlying the body; and
    a strip conductor that is electrically insulated from the semiconductor body at least by a gate dielectric and form the gate electrode in the area of the transistor; wherein:
    the strip conductor extends along a first direction in the area of the transistor, wherein, when viewed from above, the first source/drain region has a first side that is adjacent to a first edge of the strip conductor and the second source/drain region has a second side that is adjacent to a second edge of the strip conductor;

the second source/drain region is arranged offset with respect to the first source/drain region along the first direction by a distance corresponding to a width of the first source/drain region along the first direction so that the second side is not positioned across from the first side, along the second direction; and the transistor includes a charge-storing layer between the gate electrode and the semiconductor body, the charge-storing layer being a layer in which electrical charges are locally bound.

7. The integrated circuit as claimed in claim 6, wherein the first and the second source/drain regions can be optionally electrically biased positively or negatively with respect to one another.

8. The integrated circuit as claimed in claim 6, further comprising a third source/drain region that is arranged on the same side of the strip conductor as the first source/drain region and that is arranged offset with respect to the second source/drain region in the first direction.

9. The integrated circuit as claimed in claim 8, further comprising a fourth source/drain region that is arranged on the same side of the strip conductor as the second source/drain region and is arranged offset with respect to the third source/drain region in the first direction.

10. The integrated circuit as claimed in claim 9, wherein the integrated circuit further comprises adjacently to the second source/drain region a further strip conductor extending in parallel with the strip conductor and a fifth source/drain region, the fifth source/drain region being arranged on the side of the further strip conductor opposite to the second source/drain region and being arranged offset with respect to the second source/drain region in the first direction.

11. The integrated circuit as claimed in claim 10, further comprising a sixth source/drain region that is faced by a corner area of the second source/drain region so that, with the aid of the first, the third, the fifth and the sixth source/drain regions, up to four inversion channels can be formed, the four inversion channels extending to different corner areas of the second source/drain region.

12. The integrated circuit as claimed in claim 11, wherein the integrated circuit comprises a non-volatile memory circuit in which one digital information item each can be stored at each corner area of the second source/drain region.

13. The integrated circuit as claimed in claim 11, wherein the integrated circuit comprises a logical part-circuit in which the first, the second and the fifth source/drain region and the two strip conductors form two series-connected logic transistors.

14. The integrated circuit as claimed in claim 6, wherein the integrated circuit further comprises adjacently to the second source/drain region a further strip conductor extending in parallel with the strip conductor and a fifth source/drain region, the fifth source/drain region being arranged on the side of the further strip conductor opposite to the second source/drain region and being arranged offset with respect to the second source/drain region in the first direction.

15. The integrated circuit as claimed in claim 6, wherein the charge-storing layer comprises a nitride layer that is surrounded by electrical insulation layers on upper and lower surfaces.

16. A semiconductor integrated circuit comprising:

a transistor including a first source/drain region and a second source/drain region arranged in a semiconductor body, the transistor further including a gate electrode overlying the body; and when viewed from above, the strip conductor extends along a first direction in the area of the transistor, wherein the first source/drain region has a first side that is adjacent to a first edge of the strip conductor and the second source/drain region has a second side that is adjacent to a second edge of the strip conductor;

wherein:

the second source/drain region is arranged offset with respect to the first source/drain region along the first direction by a distance corresponding to a width of the first source/drain region along the first direction so that the second side is not positioned across from the first side, along the second direction; and the transistor includes a charge-storing layer between the gate electrode and the semiconductor body, the charge-storing layer being a layer in which electrical charges are locally bound; and wherein the first and the second source/drain regions each have a rectangular base area in the semiconductor body and in that the transistor forms an inversion channel that only extends between a corner area of the first source/drain region facing the second source/drain region and a corner area of the second source/drain region facing the first source/drain region.

17. The integrated circuit as claimed in claim 16, wherein the transistor stores electrical charges in the charge-storing layer exclusively at the corner area of the first source/drain region the second source/drain region and/or at the corner area of the second source/drain region facing the first source/drain region.

* * * * *

UNITED STATES PATENT AND TRADEMARK OFFICE
CERTIFICATE OF CORRECTION

PATENT NO. : 7,372,095 B2 Page 1 of 1
APPLICATION NO. : 11/213342
DATED : May 13, 2008
INVENTOR(S) : Vollrath It is certified that error appears in the above-identified patent and that said Letters Patent is hereby corrected as shown below:

In Col. 8, line 60, delete "form" and insert --forms--.
In Col. 10, line 46, delete "region the" and insert --region facing the--.

Signed and Sealed this

Twenty-first Day of October, 2008

JON W. DUDAS
*Director of the United States Patent and Trademark Office*